(12) United States Patent  (10) Patent No.: US 8,103,475 B2
Sorensen  (45) Date of Patent: Jan. 24, 2012

(54) APPARATUS FOR TESTING MULTIPLE CONDUCTOR WIRING AND TERMINATIONS FOR ELECTRONIC SYSTEMS

(75) Inventor: Brent A. Sorensen, Ogden, UT (US)

(73) Assignee: Universal Synaptics Corporation, Ogden, UT (US)

( * ) Notice: Subject to any disclaimer, the term of this patent is extended or adjusted under 35 U.S.C. 154(b) by 325 days.

(21) Appl. No.: 12/426,850

(22) Filed: Apr. 20, 2009

(65) Prior Publication Data

US 2010/0268507 A1  Oct. 21, 2010

(51) Int. Cl.
*G01R 27/28* (2006.01)
(52) U.S. Cl. ........................................................ 702/120
(58) Field of Classification Search .................... 702/120
See application file for complete search history.

(56) References Cited

U.S. PATENT DOCUMENTS

| | | | |
|---|---|---|---|
| 4,384,249 A | 5/1983 | Medina | |
| 5,744,967 A * | 4/1998 | Sorensen | 324/540 |
| 5,798,647 A * | 8/1998 | Martin et al. | 324/503 |
| 6,272,387 B1 * | 8/2001 | Yoon | 700/83 |
| 7,250,772 B2 | 7/2007 | Furse et al. | |
| 7,279,908 B2 * | 10/2007 | Blake | 324/647 |
| 7,368,919 B2 | 5/2008 | Gervais | |
| 2004/0232919 A1 | 11/2004 | Lacey | |

OTHER PUBLICATIONS

PCT/US2010/031667, Dec. 8, 2010, International Search Report and Written Opinion.

Maher, Ed; "No Fault Finder"; Aviation Today (publication date unknown) (available at http://www.usynaptics.com/Aviation%20Maintenance_No%20Fault%20Finder.htm), Dec. 18, 2004.

Maher, Ed; "Finding No Faults"; Aviation Today (publication date unknown) (available at http://www.usynaptics.com/Aviation%20Maintenance_Finding%20No%20Faults.htm), Dec. 18, 2004.

Sorensen, Brent, "The Achilles Heel of Modern Electronics"; EE-Evaluation Engineering (Jun. 2004) (available at http://archive.evaluationengineering.com/archive/articles/0604/0604modern_electronics.asp).

Sorensen, Brent et al.; "Digital Averaging, Bogus Testing: The Smoking Gun behind the Crash of Flight 587, Aging Wiring, No Fault Found, and Other Anomalous Aerospace Mishaps and Accidents" (available online from Feb. 2003 to May 2009).

Sorensen, Brent et al.; "An analyzer for Detecting Aging Faults in Electronic Devices"; Autotestcon '94, IEEE Systems Readiness Technology Conference, 'Cost Effective Support Into the Next Century', Conference Proceedings, pp. 417-421 (Sep. 20-22, 1994).

* cited by examiner

*Primary Examiner* — Aditya Bhat
(74) *Attorney, Agent, or Firm* — Workman Nydegger

(57) ABSTRACT

An apparatus for testing connections in a system has a plurality of inputs each adapted to couple to a test point in the system under test and a switching module. The switching module includes a first output selectively coupled to receive a first group of one or more of the inputs and a set of outputs corresponding in number to the plurality of inputs, each being selectively coupled to receive a corresponding one of the plurality of inputs. The apparatus may also include a meter coupled to the first switching module output and an array of nodes coupled to the set of switching module outputs, where each node couples a signal to a row sense line and a column sense line.

24 Claims, 10 Drawing Sheets

APPARATUS FOR TESTING MULTIPLE CONDUCTOR WIRING AND TERMINATIONS FOR ELECTRONIC SYSTEMS

THE FIELD OF THE INVENTION

Embodiments of the invention relate to method and apparatuses for the detection of faults in multiple conductor wiring for electronic systems. Example apparatuses have multiple operating modes, including modes for mapping test points in a system, verifying continuity, detecting constant faults, detecting intermittent faults, and analyzing multiple concurrent signals, among others.

BACKGROUND

Many existing vehicle and aircraft designs incorporate numerous separate wires connecting the various electrical and electronic devices in the vehicle system. Generally, these multiple wires are tied together into a wiring harness, which may often contain dozens of wires.

Aircraft electronics systems have particularly large numbers of wires interconnecting the aircraft electronic devices. Even a transponder may have thirteen wires connecting to an altitude encoder, and another fifteen connecting to a remote control head, for a total of almost 30 wires. Other aircraft electronics devices often connect to many more wires than this.

Vehicle and aircraft wiring systems are generally subjected to vibration and corrosive atmospheres. As a result, they often develop flawed connections. Flawed connections may be constant, or may be intermittent.

Constant faults are fairly easy to identify and fix, because the fault remains present while a technician traces the circuitry to locate the fault. Intermittent faults are hard to diagnose and repair because they occur with some randomness, and then may occur only under conditions of system stress. Even when an intermittent fault occurs while a system is under stress at a repair facility, the fault can often be diagnosed only when the fault occurs while an instrument is monitoring the faulty connection because intermittent faults often are present in the system for only a short time, too short a time to allow tracing of circuitry to locate the problem.

A method for diagnosing intermittent faults in wiring harnesses or vehicle electronic systems including wiring harnesses is for a technician to attach a latching continuity tester to each wire of the harness. The vehicle, or harness, is then stressed by vibration, heating, or cooling such that any intermittently flawed connection in the wiring will, at least momentarily, fail. The latching continuity tester detects the momentary fault, and latches the identity of the momentary fault. The tester then provides the identity of the failed connection to the technician.

A similar technique can be employed on a printed circuit card, or complete electronic module. A multichannel continuity tester is attached to the card or module, the module is then stressed. Any momentary failures are latched by the tester.

The data input and output terminations of many common electronics modules have signal levels ranging from 0 to 5 volts. Most of these modules have a TTL or CMOS integrated circuit connected to each of these signal terminations. TTL and CMOS integrated circuits generally have a parasitic diode connection between the signal termination and ground. This diode becomes forward biased when the signal termination is driven negative with respect to ground, clamping the signal termination to a level of typically −0.7 volt. This parasitic diode is commonly utilized in testing continuity of devices during the integrated circuit manufacturing process.

Signature testing has become popular for testing electronic apparatus. A signature tester monitors the performance of a circuit subjected to a repeatable stimulus, and computes a pattern or number, or signature, corresponding in some way to the response of the circuit. For very simple circuits, the signature may comprise the entire response of the circuit. For larger circuits having a more complex response, the signature bit pattern is generally substantially smaller than the entire circuit response. The signature is computed through a hashing algorithm such that all good circuits have the same signature, but most, if not all, defective circuits have different signatures. Once computed, the signature derived from the circuit under test is compared with the signature of a known good circuit. One example of signature testing using a neural network is described in U.S. Pat. No. 5,744,967, incorporated herein by reference.

SUMMARY OF EXAMPLE EMBODIMENTS

In general, example embodiments relate to systems and apparatuses for detection of faults in multiple conductor wiring for electronic systems.

In a first example embodiment, an apparatus for testing a system includes a plurality of inputs each adapted to couple to a test point in the system under test and a switching module. The switching module includes a first output selectively coupled to receive a first group of one or more of the plurality of inputs and a set of outputs corresponding in number to the plurality of inputs, each being selectively coupled to receive a corresponding one of the plurality of inputs.

In a second example embodiment, an apparatus for testing a system includes at least one row sense line and at least one column sense line and an array of nodes each having circuitry coupled thereto, the nodal circuitry being configured to selectively couple one of a signal from the system under test or an alternative signal to the at least one row sense line and the at least one column sense line. The apparatus also includes a circuit coupled to the at least one row sense line and configured to detect the signal coupled to the row sense line and a circuit coupled to the at least one column sense line and configured to detect the signal coupled to the column sense line.

In a third example embodiment, an apparatus for testing a system includes a testing module and a processor. The testing module is configured to couple to a plurality of test points on the system under test and to carry out test procedures in accordance with a testing mode to generate test results. The processor is communicatively coupled to the testing module and configured to control a testing mode of the testing module and to receive the test results. The processor is further configured to display a representation of locations of the plurality of test points relative to each other and a representation of the test results overlaid on the representation of test point locations such that a user can visually identify test points associated with the test results.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further develop the above and other aspects of example embodiments of the invention, a more particular description of these examples will be rendered by reference to specific embodiments thereof which are disclosed in the appended drawings. It is appreciated that these drawings depict only example embodiments of the invention and are therefore not to be considered limiting of its scope. It is also appreciated that the drawings are diagrammatic and schematic representations of example embodiments of the invention, and are not limiting of the present invention. Example embodiments of the invention will be disclosed and explained with additional specificity and detail through the use of the accompanying drawings in which.

DETAILED DESCRIPTION

Figure 1:
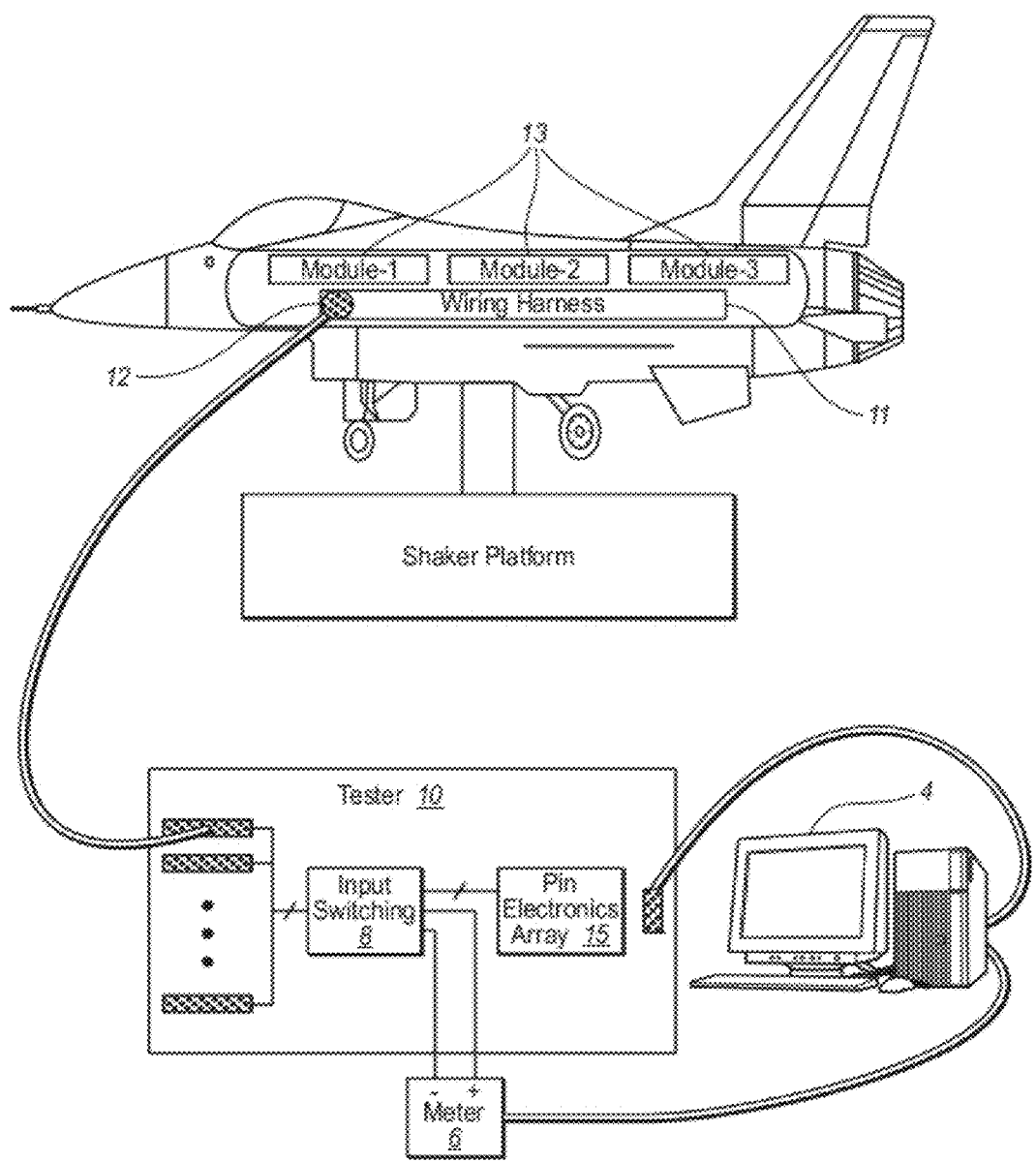
FIG. 1 is a schematic of an environment in which an example tester consistent with the present invention is used to test systems.

In the following detailed description, reference is made to the accompanying drawings that show, by way of illustration, example embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

An electronic system is tested by connecting an apparatus, such as a tester 10, to a plurality of wires in a wiring harness 11 of a system, as shown in FIG. 1. Tester 10 may be connected to a test connector 12 of the wiring harness 11, or may be connected in place of one of the electronic modules 13 of the system. Tester 10 may also be connected to a processing module, e.g., a host computer 4, and an external meter 6. Host computer 4 displays and/or prints test results for a user and controls tester 10 based on user commands and other input. External meter 6 may be a digital multi-meter that measures signals produced by tester 10 and is communicatively coupled to host computer 4. An input switching module 8 selectively couples signals received through inputs of tester 10 to a pin electronics 15 and/or external meter 6. In certain embodiments meter 6 may be integral with tester 10 and/or host computer 4 may be integral with tester 10. Therefore, the terms "tester" and "apparatus" as used herein, may refer to tester 10 or a combination of tester 10 with host computer 4 and/or meter 6, as well as equivalents thereof.

Figure 2:
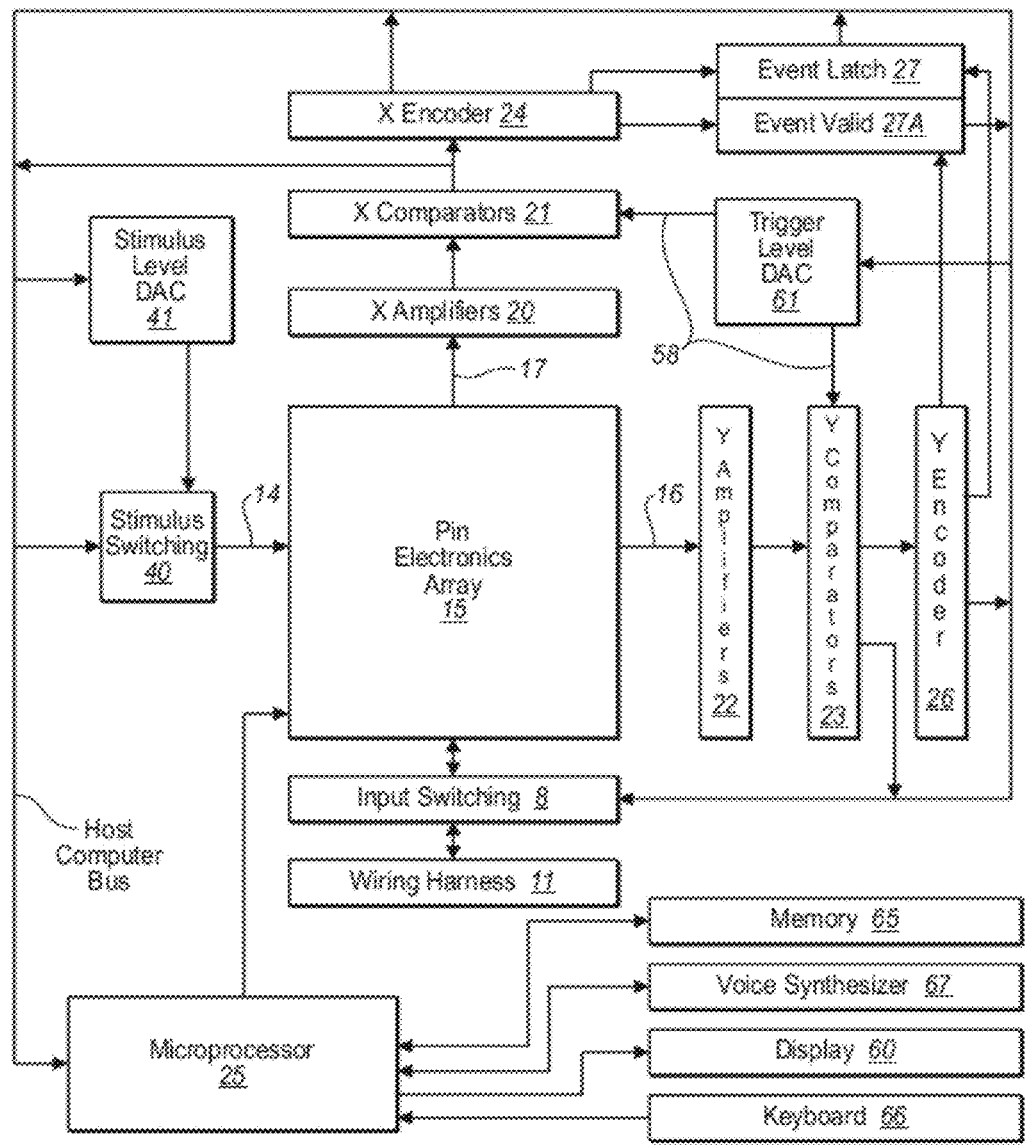
FIG. 2, a block diagram of the tester.

As shown in FIG. 2, wiring harness 11 connects to a pin electronics array 15 of tester 10 via input switching module 8. Pin electronics array 15 has a plurality (e.g., sixteen) of X sense lines 17 and a plurality (e.g., sixteen) of Y sense lines 16. Also connected to array 15 are a set of X amplifiers 20 feeding X latching comparators 21, and a set of Y amplifiers 22 feeding Y latching comparators 23. The X latching comparators 21 are readable by a microprocessor 25 of host computer 4 and feed an X encoder 24. Similarly, the Y latching comparators 23 are readable by host microprocessor 25 and feed a Y encoder 26. The X encoder 24 and Y encoder 26 are readable by host microprocessor 25, and both encoders feed an event latch 27, which is also readable by host microprocessor 25.

Wiring harness 11 comprises a plurality of individual wires. Those wires in the harness that are under test are connected, via input switching module 8, to a pin, such as pin 30 (FIG. 3), of pin electronics circuit 31 in pin electronics array 15 (FIG. 2). Each pin electronics circuit 31 comprises a pin switch 32 a node 33 connected to pin 30. If, for example, a node 33 is faulty or introduces excessive noise the node can be internally grounded by activating pin switch 32 and thereby connecting the node to ground. Pin switch 32 is also useful for verifying proper interconnection of two or more lines from the system under test. For example, pin switch 32 may be used to set a particular point at the system under test to ground. Other test points that, in a properly function system, are known to be interconnected with the grounded point may then be measured at meter 6 to verify a proper interconnection with the grounded test point, e.g., a short, open, or an expected impedance.

Also connected to node 33 is a 2K to 3K resistor 34 coupled to a row stimulus line 35, a 0.2 microfarad capacitor 36 coupled to a row sense line 37 of Y sense lines 16, and a 0.2 microfarad capacitor 38 coupled to a column sense line 39 of X sense lines 17.

Each row stimulus line of stimulus lines 14 (FIG. 2), such as row stimulus line 35 (FIG. 3), connects through a single pole, double throw, electronic switching device of stimulus switching module 40 (FIG. 2) to ground, or to a voltage controlled by a stimulus voltage Digital to Analog Converter (DAC) 41. One embodiment of tester 10 incorporates an array of pin electronics cells 31, each being connected to one of the column (X) sense lines 17 and to one of the row (Y) sense lines 16. A column of cells 31 are connected to each of the column (X) sense lines 17, and a row of cells 31 are connected to each of the row (Y) sense lines 16.

Tester 10 is capable of being operated in multiple modes in accordance with computer-generated and/or user-generated commands and signals received from host computer 4. Various testing modes involve simultaneous stimulation and/or evaluation of one or more of nodes 33 in pin electronics array 15. Other modes divert one or more signals from pin electronics array 15 to meter 6 using input switching module 8. Testing modes that involve simultaneous stimulation and/or evaluation of one or more of nodes 33 will first be described, followed by a description of modes that involve use of meter 6.

Tester 10 is capable of being operated as a multichannel intermittent continuity tester responsive to momentary open circuits. In this mode of operation, each row stimulus line of stimulus lines 14 is driven to a specific voltage, normally 3.2 volts but which may be programmable. This voltage causes a current to flow through resistor 34 of each pin electronics circuit, and through the parasitic diodes of any electronics devices attached to the wiring harness.

Some or all of the electronics modules of a system may be replaced with a connector having a short-circuit to ground for test purposes.

When vibration, such as from a technician shaking the wiring harness or produced by a shaker table, temperature excursions, bending moments or other stresses applied to the system produce an open circuit on any of the wires under test, current ceases to flow from pin 30 to node 33 of the pin electronics circuit attached to the corresponding defective wire. As a result, the voltage at node 33 changes, moving in the direction of the applied row stimulus voltage, or typically towards 3.2 volts. This change, or signal, couples through the capacitors 36 and 38 into the row (Y) and column (X) sense lines 37 and 39 attached to the pin electronics cell attached to the wire on which the event occurred, causing a signal thereon.

The signal on the X sense line 39 is amplified by the associated X sense amplifier 45, and applied to the associated X latching comparator 46. Similarly, the signal on the Y sense line 37 is amplified by the associated Y sense amplifier 47 and applied to the associated Y latching comparator 48.

Figure 4:
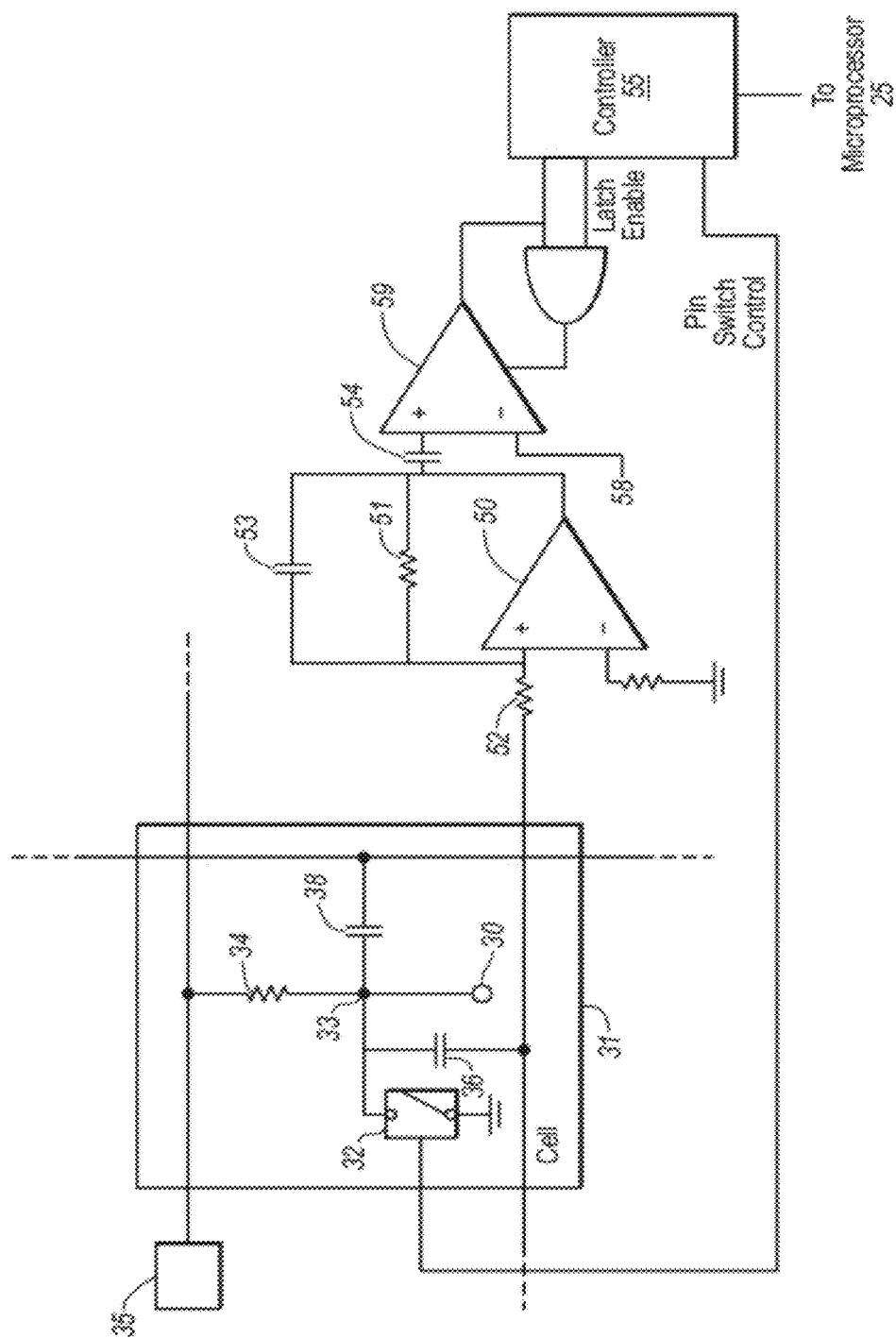
FIG. 4, a schematic of a channel of sense amplifiers and latching comparators used to sense signals from the pin electronics array.

As shown in FIG. 4, each of the X and Y sense amplifiers comprises an operational amplifier 50, with gain set by the ratio of resistor 51 to resistor 52. A pole is introduced into the frequency response of the amplifier by a small feedback capacitor 53. The amplifier output is capacitively coupled through capacitor 54 to the comparator 59. The amplifier output is coupled to a latching comparator 59. When the output of amplifier 50 is greater than (or, in certain applications, less than) a threshold set by the voltage on a latching comparator reference line 58, latching comparator 59 asserts an output signal. While a latch enable signal from a controller 55 is on, the output signal is held asserted regardless of what is received from amplifier 50.

The outputs of X latching comparators 21 are coupled to X encoder 24 (see FIG. 2). Outputs of Y latching comparators 23 are similarly coupled to Y encoder 26. Each encoder generates a binary code indicating which, if any, of its input lines is active or asserted. When an event-valid signal from each of the X encoder 24 and the Y encoder 26 are active, indicating that a single row latching comparator output and a single column latching comparator output are both active, the binary codes from both X encoder 24 and Y encoder 26 are latched in the event latch 27, and an event-valid flag 27*a* is set. When microprocessor 25 finds the event-valid flag 27*a* is set, the binary codes describing the event are read from event latch 27 to microprocessor 25, and host computer 4 generates a suitable indication of the event on its display 60 and on its speech synthesizer 67. The event-valid flag is cleared when the microprocessor reads the flag and the latch enable signals for the latching comparators that generated the event are turned off, thereby allowing a further event to be latched.

In addition to the signal on the row (Y) and column (X) sense lines connected to the pin electronics cell 31 attached to the wire on which the event occurred, a weaker signal couples from these sense lines, through the capacitors in other cells 31, to other sense lines. One embodiment may incorporate a buffer amplifier in each cell to alter this coupling, and may couple the signal to the sense lines through a resistor. The comparator reference line 58 is set or driven, through a trigger level DAC 61, by microprocessor 25, to a threshold level such that a momentary opens event will be detected by the comparators on the row (Y) and column (X) of the pin electronics cell 31 on which the event occurred. The comparator therefore is equivalent to a threshold detector with a DAC-adjustable threshold. The event code formed by concatenating the output of the X encoder 24 with the output of the Y encoder 26 is latched in the event latch 27 and therefore corresponds to the identity of the pin electronics cell 31 of the pin electronics array 15 connected to the wire of the wiring harness 11 on which the event occurred.

In addition to the comparators for the active sense lines connected to the active cell connected to the faulty wire, other comparators may fire due to weaker signals that couple into other sense lines from the active sense lines. As all signals have a finite risetime, and the coupled signals have the same or a slower risetime than the signal on the active lines, and the coupled signals are weaker than the signal on the active lines, the signal on the active lines will reach the threshold voltage before the signal on the other sense lines. The threshold voltage on reference line 58 is chosen such that the latching comparator 59 for the pin electronics cell connected to the fault wire is latched and the event code loaded into the event latch 27 before any additional comparators fire. The threshold is also chosen such that the latching comparators will detect only valid events of a selectable event amplitude and duration.

Figure 3:
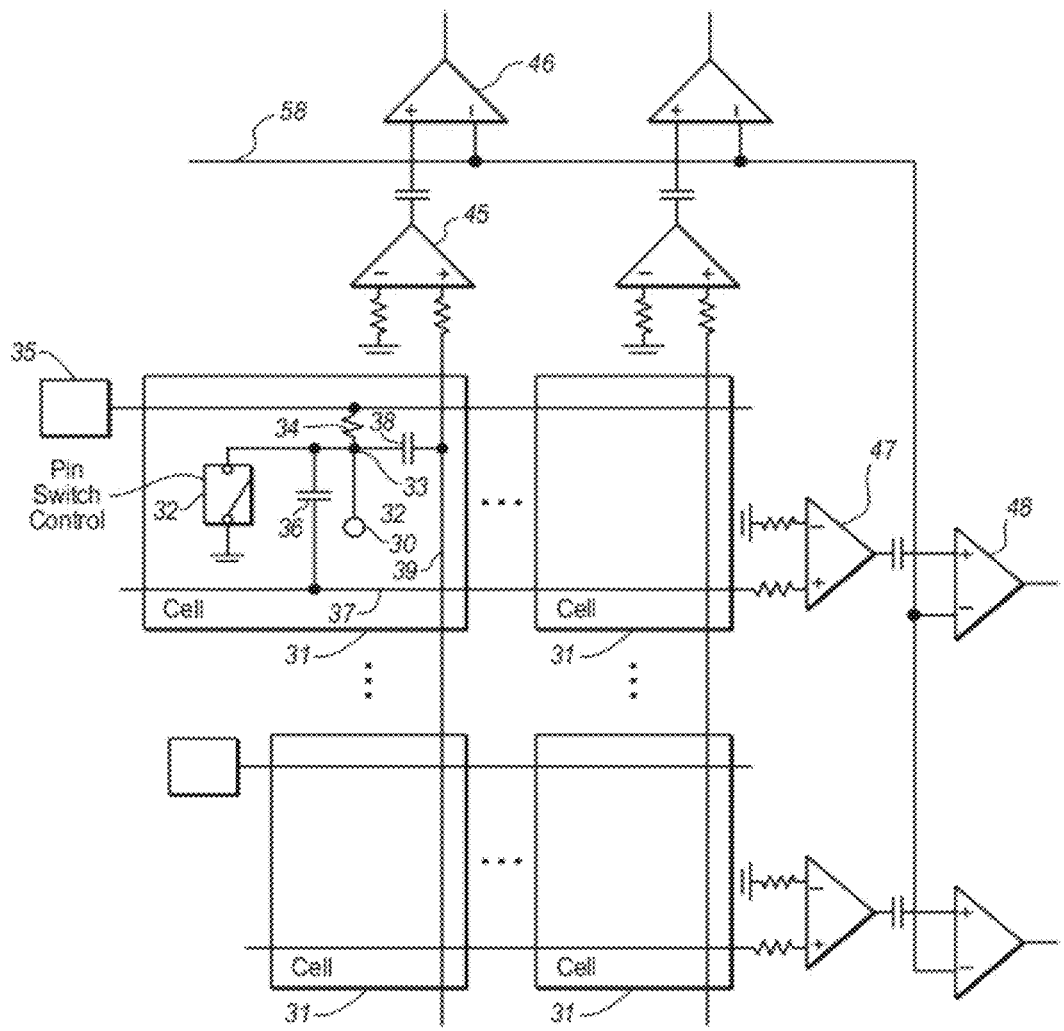
FIG. 3, a partial schematic of a pin electronics array of the tester.

Pin switch 32 of FIG. 3 may be used to mute a stimulus at a particular cell if desired. For example, if a response to the stimulus at a particular cell 31 interferes with successful detection of signals from other cells, the stimulus at that cell can be muted by grounding the corresponding node 33 with pin switch 32.

Tester 10 may also be operated as a multichannel static continuity tester by driving the row stimulus lines 35 of all rows to ground. After sufficient time has been provided for the voltages on the sense lines to stabilize, a selected row stimulus line is driven to a non-zero level, such as 3.2 volt. Those pin electronics cells 31 on this stimulus row line 35 will generate a signal inversely proportional to the current that flows through any wire and termination connected to their pins. The comparator reference line 58 is set, through the trigger level DAC 61, to a suitable threshold level such that open pins on the selected row stimulus line generate a comparator output signal in an allotted time, and that pins sourcing a current generate a signal in a greater time. After stimulating the row line, the microprocessor waits the allotted time, reads the comparator outputs, formats the data for display, and saves the comparator output pattern in its memory 65. After sufficient time has elapsed for the voltages on the sense lines to stabilize, the process is repeated for another selected row stimulus line. The pattern of opens and shorts or continuity observed is displayed to the technician row by row, and as an overall pattern for the system. The pattern of opens and shorts for the system is the concatenation of the patterns obtained for each row stimulus line.

In addition to testing opens and shorts, tester 10 may indicate which pins are connected through a diode, such as a parasitic diode of an integrated circuit, to ground. This is done by first driving a row stimulus line from 0 to a first voltage such that most diode loads will not substantially conduct, such as −0.7 volts. The microprocessor monitors the comparator outputs and derives a pattern of opens and shorts therefrom. The row stimulus line is then driven from the first voltage to a voltage approximately double in magnitude where most diode loads will substantially conduct, such as −1.4 volts. The microprocessor again monitors the comparator outputs and derives a second pattern of opens and shorts therefrom. The differences between the first and second patterns indicates which pins are connected to a diode load, and forms a component of the overall pattern for the system.

Tester 10 can also identify, and measure, a capacitive load by observing the time from a transition of the row stimulus line to a transition of the column sense line comparator output. Similarly, the tester can also measure resistive loads.

In another test mode of tester 10, rows are stimulated as described above in the multichannel static continuity test mode. Once the row has been stimulated, the microprocessor repeatedly reads the column comparators until the array has stabilized. The microprocessor then processes the data obtained to determine an overall pattern of opens, shorts, and capacitances for the system.

Once an overall pattern is derived for the system under test, microprocessor 25 compares this pattern with an expected-data pattern for a technician-designated system in a database in its memory 65. Any deviations of the measured pattern from the expected pattern are ranked and displayed.

Should the user request assistance, the microprocessor searches the database for similar patterns. These further patterns include patterns of known good systems and patterns of systems with known, previously identified, faults. Should a match, or a near match, be found, the microprocessor places information on its display 60 regarding the closeness of the match, with text describing the system and fault (if any) of the pattern to which the match was found.

Software neural network techniques are used in matching the system pattern to the patterns in memory because these techniques can identify patterns that are near matches but are not identical to the system pattern.

Prior to operation of the tester, the microprocessor 25 requests, via the display 60, that the technician operating the tester enter, via keyboard 66, an identification of the system under test. If the system pattern does not exactly match the database pattern for the system identified by the technician, and an exact match or a near match is found to a pattern in the database, the microprocessor uses the display 60 to ask the technician to verify the system identification.

Pin electronics array 15 of tester 10 also operates as a capacitively coupled neural network. The network has a plurality of input lines, which are the row stimulus lines 14. The network has a plurality of sense lines, the plurality of row (Y) 16 and the plurality of column (X) 17 sense lines. The signal on a column sense line is a weighted sum of a transition of the row stimulus lines. Each weight depends on the loads connected to the pins of the pin electronics array 15.

Figure 5A:
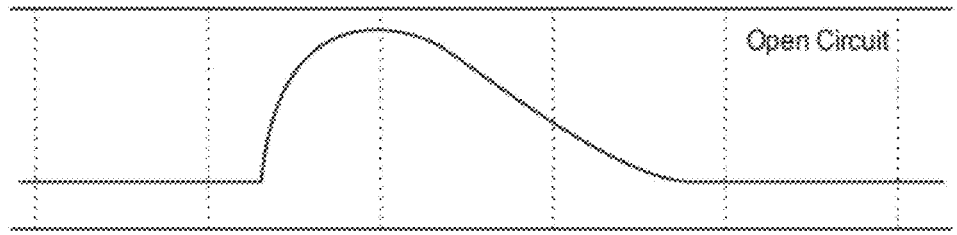
FIG. 5, a waveform diagram showing signals developed with different loads on a pin electronics array cell.
Figure 5B:
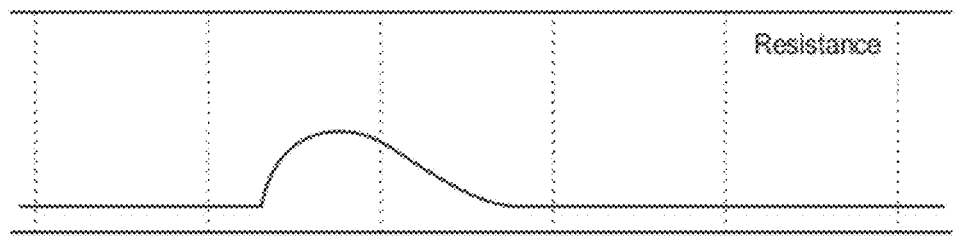
Figure 5C:
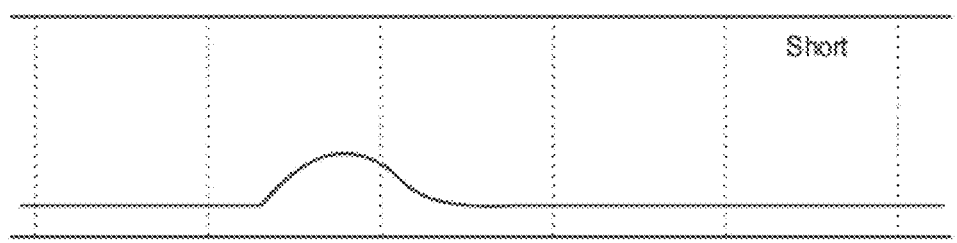
Figure 5D:
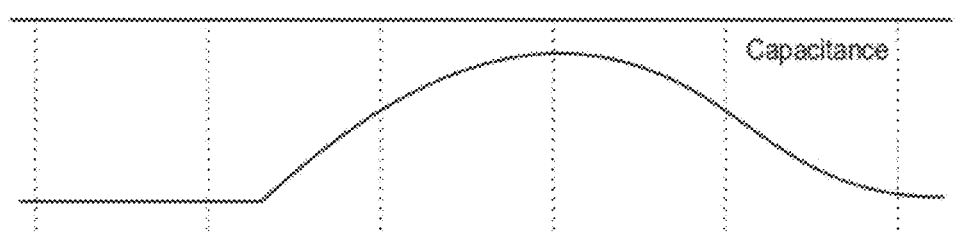
Figure 5E:
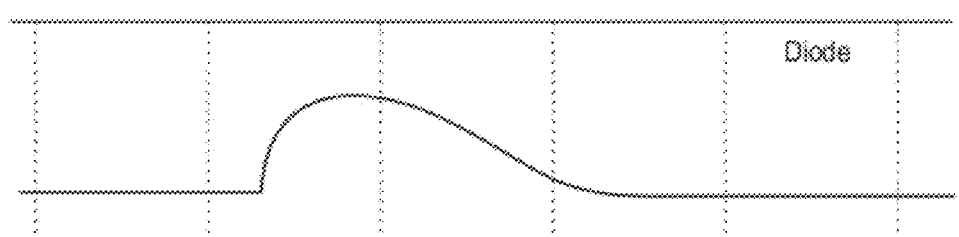

For example, consider a first pin electronics cell 31 having an open circuit load connected to it, and a second pin electronics cell having a forward-biased diode termination load connected to it. A signal on the row stimulus line will couple onto the column and row sense lines more strongly at the cell having the open circuit (FIG. 5a) than from the cell having the diode load (FIG. 5e), which in turn will couple more strongly than a cell having a short-circuited load (FIG. 5c). Similarly, a cell having a highly capacitive load (FIG. 5d) will couple with a signal having a slower initial edge rate than a cell having an open circuited load.

Should two of the row stimulus lines transition together, but in opposite directions (e.g., line A from 3.2 V to 0V, and line B from 0V to 3.2V), the signal on a column sense line will be the sum of the signals coupled through the cell on stimulus line A and the cell on stimulus line B. It is therefore possible to achieve negative, as well as positive, input-weight products in the signal summation on each line.

The pin electronics array therefore forms a neural network, where the weights of the network depend on the loads connected to pins of the array, and the inputs of the network are the stimulus lines 14. Alternatively, the network may be stimulated through the pins of the pin electronics array.

The time that a sense line will take to recover to a threshold level depends on the signal on that line.

Tester 10 may also be operated in a signature analysis mode. This is done by setting the row stimulus lines to a first pattern, with the stimulus voltage DAC set to a first level, and allowing the circuit to equilibrate. The trigger voltage DAC 61 is set to a suitable threshold value. The stimulus lines are switched to a second pattern, or the stimulus DAC 61 set to a different voltage, and the microprocessor reads and stores in memory the column (X) and row (Y) comparator outputs repeatedly, thereby monitoring a time domain response of the network to the change of the stimulus lines.

The pattern read by the microprocessor is then reduced to a signature dependent on the nature of the interaction of the loads connected to the pin electronics array and the stimulus signal. This reduction may be accomplished by extracting, for each sense line, a sequence of numbers indicating the length of time for which that sense line remains at each value.

One or more sensed signatures, each indicating the response of a sense line to one or more changes of the stimulus line pattern, are combined to form an overall signature for the system under test. A multiplicity of overall signatures from the same circuit are then combined, as by averaging, to form a composite signature for the circuit.

Once a composite signature is derived for the system under test, microprocessor 25 compares this signature with further composite signatures in a database in its memory 65. These further composite signatures include signatures of known good systems and also signatures of systems with known, previously identified, faults. The comparison is performed with a software neural network, trained on a multiplicity of signatures from various good and defective systems, allowing near matches to be identified as well as exact matches. Should a match, or a near match, be found, the microprocessor places information on its display 60 regarding the closeness of the match, with text and graphics describing the system and fault (if any) to which the match was found.

In an alternative embodiment, the event latch is coupled to receive the outputs of the latching comparators. In this embodiment, a first OR gate is coupled to receive the plurality of row latching comparator outputs, and a second OR gate is coupled to receive the plurality of column latching comparator outputs. The event latch is loaded whenever an AND gate determines that the outputs of the first OR gate and the second OR gate are both true. In this embodiment, the event latch comprises an edge-triggered D-type register, triggered on the positive edge of the AND gate output. To ensure that the event latch loads the correct information, a delay of the OR gates and the AND gate is greater than the setup time of the edge-triggered D-type register.

In this embodiment, the event latch contains data corresponding to all the active row and column sense lines, from which the identity of the active row and column sense lines can be determined by the microprocessor. Therefore, as with other embodiments, the register is loaded with data comprising the identity of the row sense line latching comparator and the column sense line latching comparator that detected the signal. In the multichannel intermittency test mode, the microprocessor utilizes the event latch contents in determining the wire upon which a momentary open event occurred, and displays this information to the technician.

The examples described above use a two dimensional array of pin electronics cells, organized as rows and columns. The array may, however, be extended to a three (or more) dimensional array wherein a signal from each pin electronics cell may couple into a row sense line, a column sense line, and a plane sense line.

A signature dependent upon the resistances, capacitances, and diode characteristics of the system wires connected to a tester can be derived in other ways. For example, an alternative implementation of an analog signature tester utilizes a custom integrated circuit, built in a 24-pin DIP, having sixteen pin electronics circuits and a serial interface to a microprocessor. Each pin electronics circuit of this implementation contains circuitry to measure the resistance, capacitance, and diode characteristics of any wire attached to the pin electronics circuit. A microprocessor then utilizes this information to compute a signature for the system under test.

The term "pin electronics" is standard in the industry for that portion of a test device replicated for each wire that may be tested at a given time. Each pin electronics module, or cell, has a connection point, or pin, to which an individual wire of the system may be connected. The pin need not be a male connector pin, the traditional integrated circuit tester pin electronics typically connects to a terminal of a female socket or contactor apparatus that connects the "pin" to a wire of the system under test.

Figure 6:
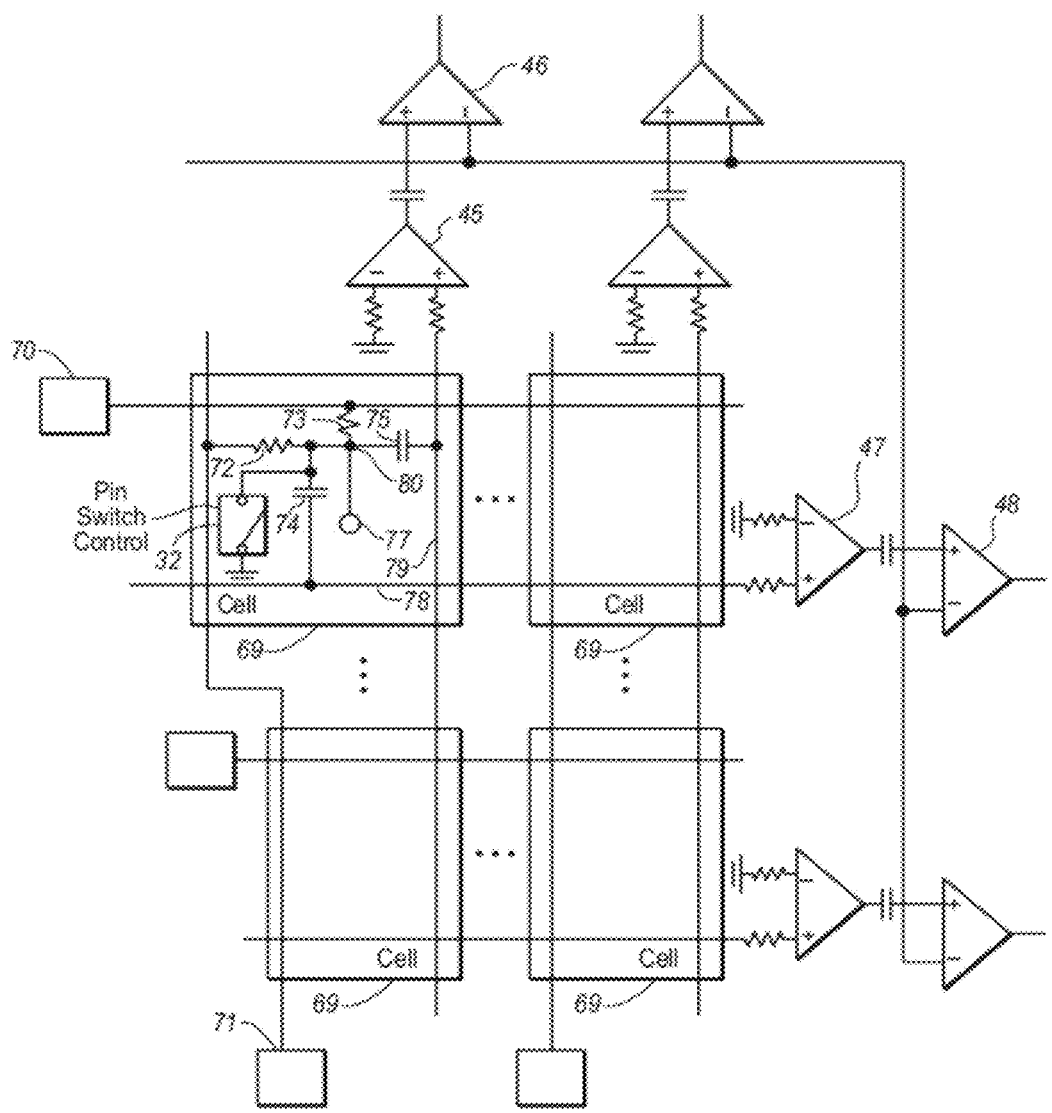
FIG. 6, a partial schematic diagram of an alternative form of the pin electronics array having both row and column stimulus lines provided.

FIG. 6 shows an alternative embodiment of tester 10, which incorporates column stimulus lines as well as row stimulus lines. This embodiment incorporates a pin electronics cell 69 at the intersection of each row stimulus line 70 and column stimulus line 71. The cell has a resistor 72 connecting the column stimulus line 71 to a node 80 in the cell. Similarly, the row stimulus line 70 connects through a resistor 73 to the node 80. The node 80 is coupled through a capacitor 74 to a row sense line 78, and by a capacitor 75 to a column sense line 79. Node 80 is also selectively coupled by a pin switch 32 to ground.

This alternative embodiment may be operated in the same manner as the embodiment previously described in connection with FIG. 3 by grounding the column stimulus lines. This embodiment can also be operated in a column-at-a-time static continuity test mode by driving the column stimulus line 71 to a non-ground level, typically 3.2 V, by driving a selected column stimulus line to a non-grounded level while grounding all other column stimulus lines, and grounding the row stimulus lines. This column continuity test mode may provide additional visibility of faults beyond that available with the row continuity test mode alone. Similarly, visibility of the load attached to a particular pin electronics cell may be enhanced by stimulating both the row and column stimulus lines to which that cell 69 is connected.

This alternative embodiment may be stimulated by changes in column stimulus lines to provide additional response patterns in the signature analysis mode.

Figure 7:
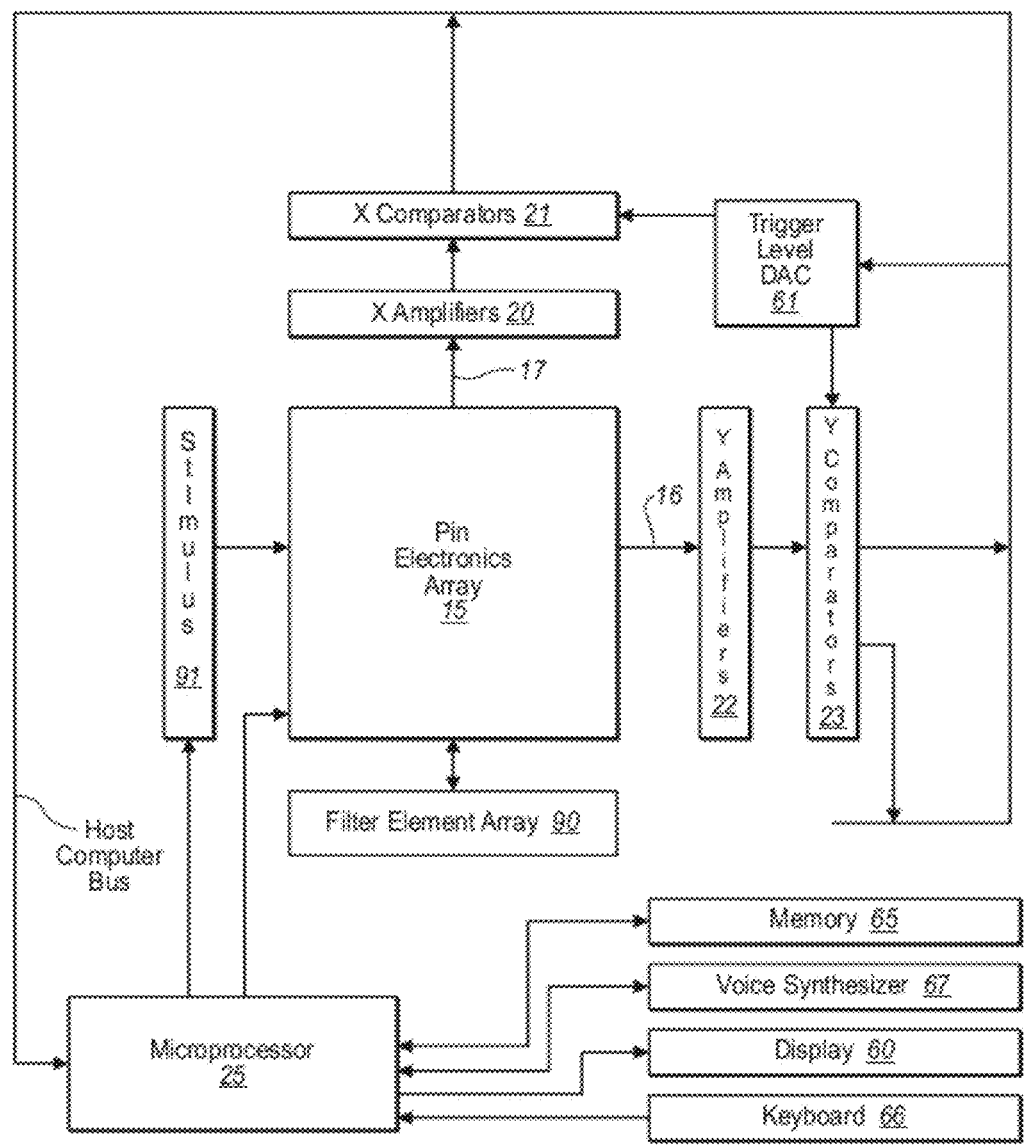
FIG. 7, a block diagram of the system as configured for analyzing characteristics of a signal.

As shown in FIG. 7, tester 10 may also be operated in a neural network mode to provide useful information about the nature of a stimulus signal 91. In this mode of operation, the unknown signal 91, or signals, corresponding thereto is coupled into the array by coupling it to one or more row stimulus line 35 (best seen in FIG. 3), one or more pins 30 of the array 15, or into the enable controls of the stimulus switches 40. An array of suitable filter elements 90 are then connected to some or all remaining pins 30 of the array 15. The row 23 and column 21 comparators are set to a suitable level by trigger level DAC 61. A signature is then generated by repeatedly sampling the outputs of row 23 and column 21 latching comparators and processing this information in microprocessor 25. A similar signal should produce a similar signature.

Alternatively, useful information about one or more signals may be derived by using a similar array but where the resistance and capacitance values of the pin electronics cells 30 are not identical from cell to cell. With this alternative, no filter components need be added to the array. Instead, the signal is injected into one of the row stimulus lines 14, or preferably into one or more pins 30 of one or more selected pin electronics cell 31. The signal on each of the X and Y sense lines of the cell array is then a function of the signal, and of the resistances and capacitances throughout the array, and will vary from sense line to sense line because of the non-uniform resistances and capacitances throughout the array. The pattern detected by the comparators will therefore be a function of the signal.

In this signal analysis mode, the microprocessor 25 repeatedly samples the comparator outputs and stores the samples into memory. The time-dependant pattern detected by the X 17 and Y 16 comparators and stored in memory by microprocessor 25 is a function of the waveform of the one or more signals.

The waveform-dependant pattern read by the microprocessor is reduced by the microprocessor to a signature and analyzed by a software neural network in the manner previously discussed in connection with the system signature analysis mode. The software network, when appropriately trained, can distinguish between such signals as a half-sine pulse and a square pulse.

Figure 8:
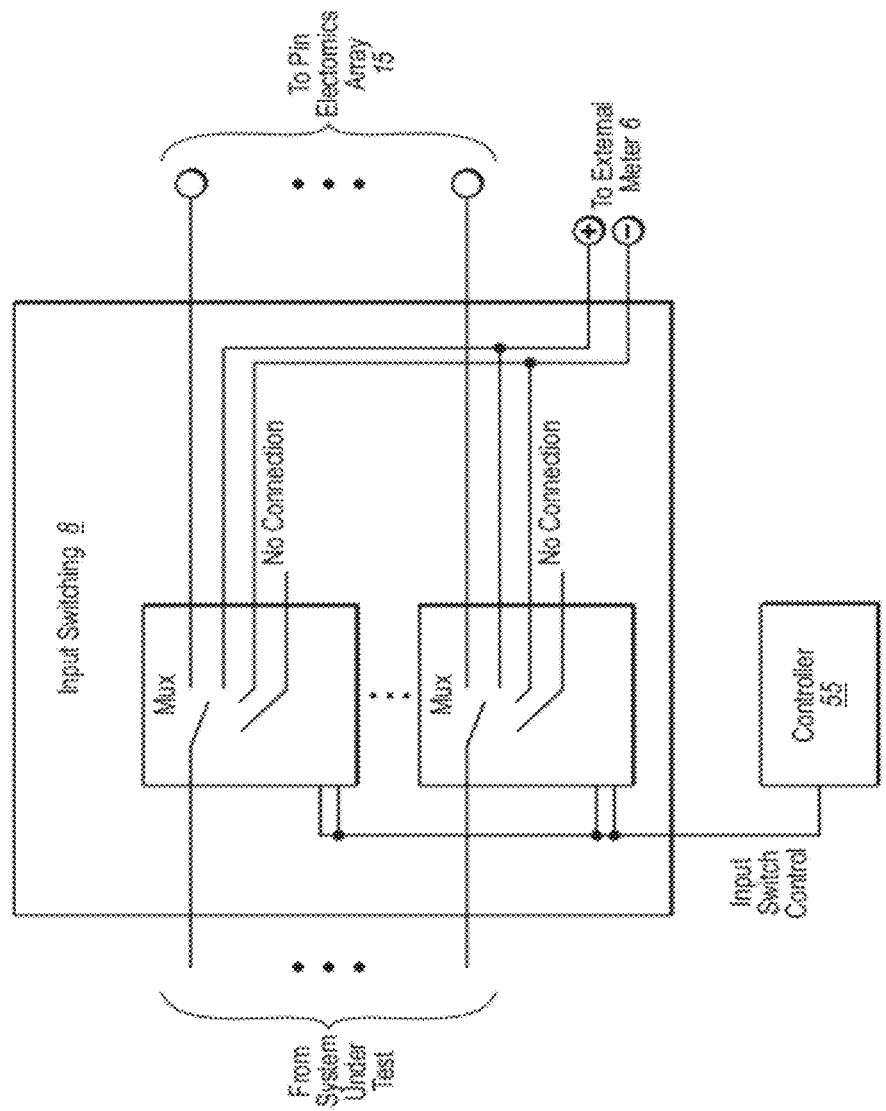
FIG. 8, a partial schematic of a switching module in the tester.

Testing and operating modes of tester 10 that involve use of meter 6 will now be described with reference to FIGS. 8 and 9. FIG. 8 shows details of input switching module 8. Controller 55 on tester 10 receives and interprets commands from microprocessor 25 on host computer 4 to control input switching module 8 to couple one or more of the received signals to meter 6, as opposed to pin electronics array 15 (and its associated circuitry). Alternatively, controller 55 may be omitted and switching commands may be received at input switching module 8 from microprocessor 25. Input switching module 8 includes a bank of multiplexers (i.e., a mux-bus), one for each of the signals of interest and received from the system under test.

Each multiplexer is capable of switching its respective input signal to be coupled to one of several outputs, including an output connected to pin electronics array 15, one connected to a first bus line, one connected to a second bus line, and one connected to nothing (i.e., floating). The first and second bus lines lead to first and second output jacks, to which meter 6, or some other measurement device, is connected. The first and second output jacks may be configured to interface with standard measurement device probes. Alternatively, one or both output jacks (or another output jack leading from another multiplexer output, not shown) may be a male or female coaxial output jack configured for interconnection with a coaxial line. With the bank of multiplexers each having multiple outputs, as described, a variety of modes are possible, such as, a shorts testing mode, a system mapping mode, and a continuity testing mode.

In a shorts testing mode, test points from a system to be tested are connected to inputs of tester 10, which in turn are received at each multiplexer of input switching module 8. A first test point and second test point are coupled to the first and second probes of meter 6 using the multiplexers corresponding to the first and second test points to verify no unwanted short is present between the test points. Next, the first and second test points are both coupled to the first probe of meter 6 and a third test point is coupled to the second probe to check for a short between the third test point and either of the first and second test points. The process continues, checking for a short in each individual test point with respect to any other previously evaluated test point. If at any time a short is found, a user is automatically presented with an indication of a short and a location of the most recently evaluated test point via display 60 and/or voice synthesizer 67. Tester 10 enters a trace mode, by either a menu selection or automatically, to detect which of the other evaluated test points is shorted to the most recently evaluated test point. For example, the trace mode couples the most recently evaluated test point to one of the meter probes and couples each of the other evaluated test points to the other meter probe in a sequence to identify which of the other test points has (or have) an unwanted short. An indication of the detected short and the location of the other test point(s) having a short is communicated via display 60 and/or voice synthesizer 67.

In a mapping mode of tester 10, a known working system is connected to tester 10 for making a map or set of gold standard reference data to which test data from other systems is later compared. Test points from a system to be tested are connected to inputs of tester 10, which in turn are received at each multiplexer of input switching module 8. The multiplexers are then switched so as to permit meter 6 to measure an impedance or resistance between every combination of two test points. For example, a first multiplexer coupled at its input to a first test point is connected to a first one of the bus lines (e.g., the bus line connected to a positive meter probe) while all other multiplexers are connected in sequence to the second bus line (e.g., that which is connected to the negative meter probe). A measurement of impedance or resistance between the first test point and every other test point is taken with the meter probes as the multiplexers are automatically switched in the appropriate sequence. Similar measurements may be made for all other test points such that an impedance or resistance measurement is made between every combination of test points. Microprocessor 25 receives each impedance or resistance value and records the values in memory 65 as a gold standard for subsequent comparison with data from other systems under test. The mapping mode may also use the recorded values to determine nodal combinations of test points, i.e., groups of test points that are interconnected by non-open connections, where a non-open connection between two test points is one that does not exceed a threshold level (e.g., 250 ohms) of resistance.

In a continuity testing mode of tester 10, test points from a system to be tested are connected to inputs of tester 10, which in turn are received at each multiplexer of input switching module 8. The multiplexers are switched as in the mapping mode to sequentially couple each combination of test points in the system under test to meter 6. An impedance or resistance is measured between pairs of test points in each nodal combination determined in the mapping mode and the measured values are received at host computer 4. The microprocessor 25 or other circuitry in host computer 4 is operable to compare the measured impedance or resistance values to gold standard reference data previously recorded in the mapping mode using a known working system.

If a discrepancy that exceeds a first predetermined threshold level (e.g., plus or minus five ohms) is found, an indication of the discrepancy and its location in the system under test is communicated via display 60 and/or voice synthesizer 67. A user is automatically presented with a view of, or a selectable option to view, precise real-time measurement data from the identified test point to more easily troubleshoot the problem.

Figure 9:
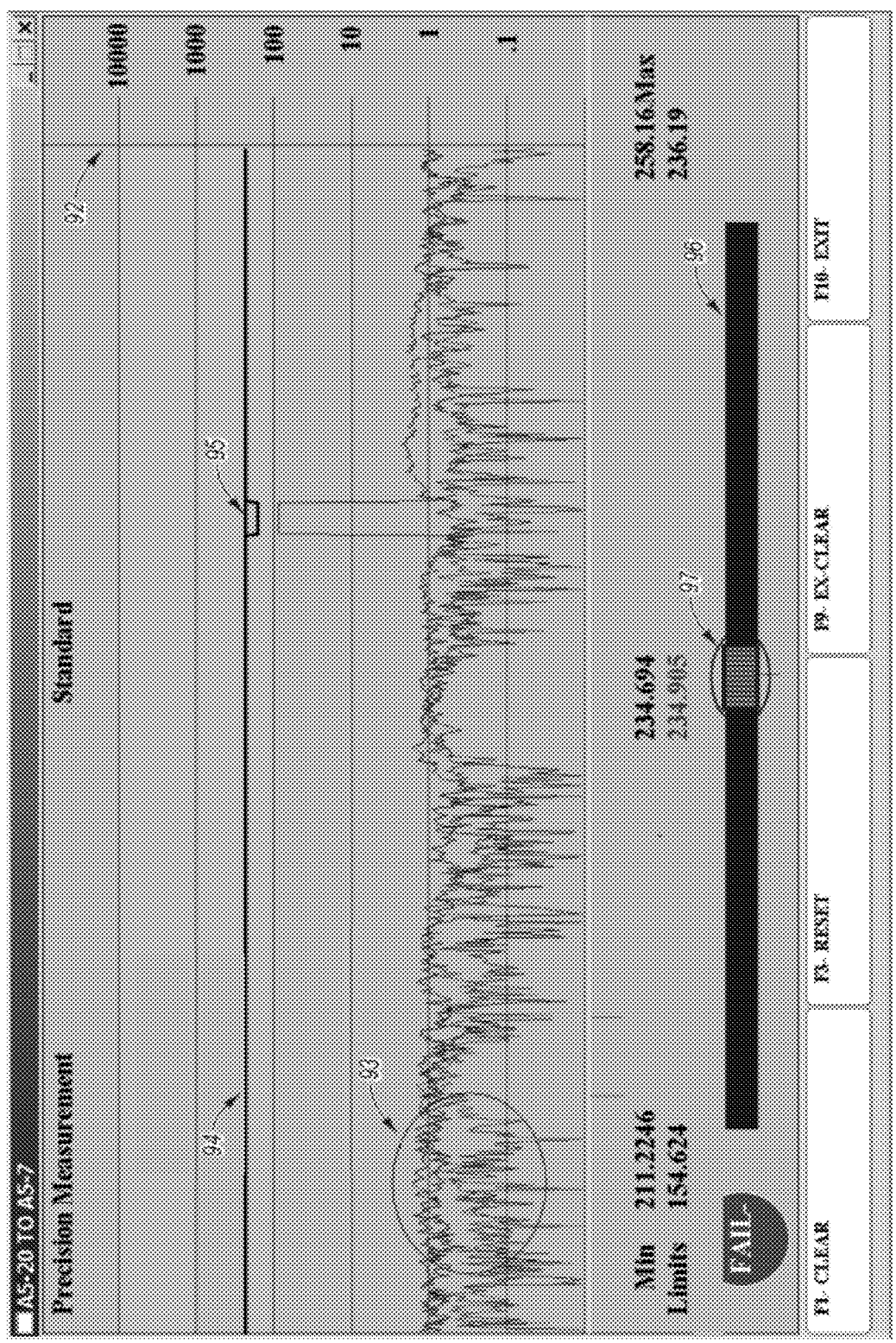
FIG. 9, a first user interface displayed for a system under test.

FIG. 9 is an example interface presented by display 60 in which measurement data is presented real-time in a scope-like view. The scope-like view includes a vertical impedance/ohm axis 92, which may be a logarithmically scaled axis. A logarithmic scale, for example, amplifies small variations in the measurement data as compared to a linear axis. By logarithmically amplifying the measurement variations over a period of time, subtle signs of intermittency in a connection can be seen and correlated with physically applied stresses, such as wiggling or tapping of a wire or soldered connection in the system under test. Thus, even signs of an intermittent connection that would otherwise go undetected, e.g., where the intermittency does not cause a measured resistance to vary outside acceptable tolerance limits, can be visually detected in the logarithmic view. In addition, a time scale along the horizontal axis may be zoomed in to display intermittencies that could otherwise escape visual detection.

The example interface in FIG. 9 represents what a user might see after several minutes of monitoring. An identification of the nodes being tested is presented in the upper left corner (e.g., A5-20 and A5-7 are shown). A graphical representation of measurement data is plotted left to right over time with subsequent graphs superimposed over preceding ones. Thus, a user can physically manipulate any suspected areas of the system under test while watching a real-time report of the measurement data using the logarithmic scale to visually identify any small changes in resistance.

The data plotted in region 93 includes a graph showing negative changes in resistance with respect to a gold standard and another graph, represented with a different color, showing positive changes in resistance with respect to the gold standard. In the example interface shown, the graphs are showing an intermittent change in resistance mostly of less than half an ohm with an occasional departure of up to one ohm. The data plotted above, represented by a line 94, corresponds to an actual resistance value between the test points under test. A dip 95 in line 94 on the right side of FIG. 9 and the coincident increase in the graph below indicate a decrease in resistance of about one hundred ohms. Although such a large change is visible in both line 94 and the graphs of region 93, smaller changes are more easily viewed in the graphs of region 93.

A horizontal bar 96 at the bottom of FIG. 9 displays measured resistance in real-time along a horizontal, linear scale. A dark portion 97 in the middle of horizontal bar 96 moves left or right as measured resistance changes.

A second predetermined discrepancy threshold level (e.g., 250 ohms) may be used to detect whether a pair of test points have an open connection with respect to each other. When an open connection is detected, indication of the open connection and its location is communicated via display 60 and/or voice synthesizer 67. A detailed view of measurement data is less likely to be of aid in troubleshooting an open connection. Therefore, the option of viewing the precise real-time measurement data is not automatically provided to the user, but may be viewed if, for example, the user navigates to the appropriate option in an interface menu. The first and second predetermined discrepancy thresholds level may be preset by a manufacturer of tester 10 or may be user-configurable. In addition, one or both of the thresholds may be the same for all test points or may vary in accordance with individual user-configurable settings.

Figure 10:
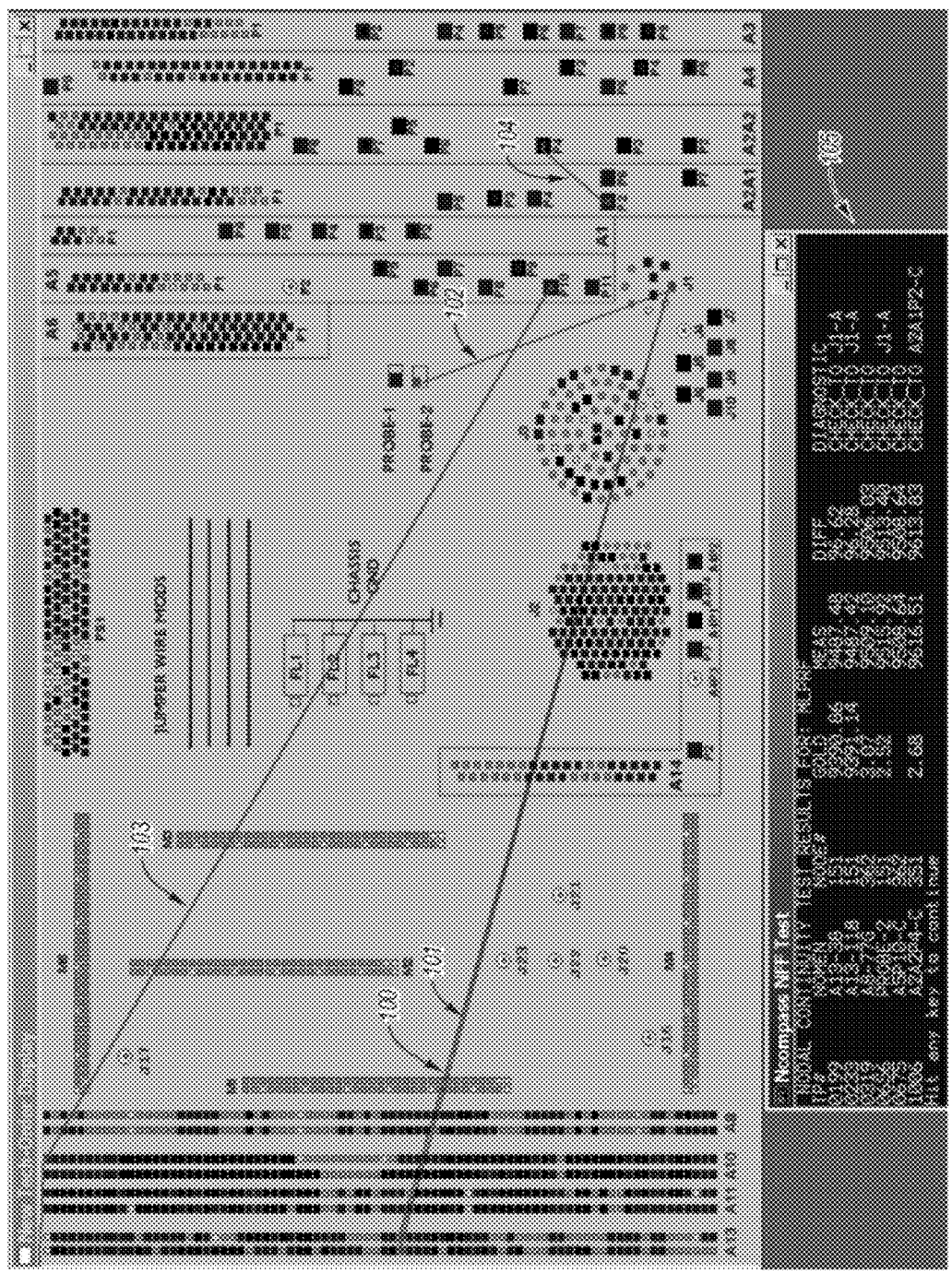
FIG. 10, a second user interface displayed for a system under test.

FIG. 10 is an example interface presented by display 60 as part of a continuity test. The display shows a test point map unique to a particular system under test. The test point map is a representation of locations of a plurality of test points relative to each other in the system under test. Overlaid on the test point map is a representation of test results such that a user can visually identify test points associated with the test results. For example, lines 100-104 represent results of a continuity test in which the impedance measured between the various test points linked by the lines is higher or lower than the corresponding expected gold standard value.

A narrative of test results is also displayed. In the example interface shown the narrative is provided in a table 105 below the test point map. Table 105 includes various columns and rows. Each row, for example, represents a continuity test performed on a pair of test points. The data in a row includes an identity of the test points, an identity of the test points' nodal combination, a gold standard resistance value expected for the corresponding test points, a measured resistance value, a calculated difference between the measured value and the gold standard value, and a diagnostic recommendation. As the test progresses rows are added in real-time to table 105 so that a user can track testing progress visually. Lines, such as lines 100-104 are also added to the test point map in real-time.

The processor in host computer 4 is configured to display test results and progress using various colors. For example, test points that have been tested may be color coded with a first color and test points that have not been tested may be color coded with a second color. Thus, a user is able to track testing progress. The test results can also be displayed by color coding malfunctioning test points with a third color, while test points that have been determined to function properly may be color coded with the first color. A malfunctioning test point is one that, for example, has an unwanted short or an impedance value that does not match the gold standard.

Embodiments described herein may comprise or utilize a special purpose or general-purpose computer including computer hardware and firmware, as discussed in greater detail below. Special purpose or general-purpose computers include, for example, host computer 4 and controller 55 on board tester 10. Controller 55 may be may be, for example, a complex programmable logical device or a field programmable gate array on board tester 10. Various components of tester 10 (e.g., X and Y encoders 24 and 26, event latch 27, event-valid flag 27a, trigger level DAC 61, and/or stimulus voltage DAC 41) may be implemented in programmable logic on controller 55. Alternatively, functions of one or more such components may be performed by host microprocessor 25. If, for example, all such functions are performed by host microprocessor 25, controller 55 may be omitted.

Embodiments within the scope of the present invention also include physical and other computer-readable media for carrying or storing computer-executable instructions and/or data structures. Computer-readable media include, for example, memory 65 on host computer 4 and registers on tester 10. Such computer-readable media can be any available media that can be accessed by a general purpose or special purpose computer system. Computer-readable media that store computer-executable instructions are physical storage media including recordable-type storage media. Computer-readable media that carry computer-executable instructions are transmission media. Thus, by way of example, and not limitation, embodiments of the invention can comprise at least two distinctly different kinds of computer-readable media: physical storage media and transmission media.

Physical storage media includes RAM, ROM, EEPROM, CD-ROM or other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links which can be used to carry or transport desired program code means in the form of computer-executable instructions or data structures and which can be accessed by a general purpose or special purpose computer. Combinations of the above should also be included within the scope of computer-readable media.

However, it should be understood, that upon reaching various computer system components, program code means in the form of computer-executable instructions or data structures can be transferred automatically from transmission media to physical storage media. For example, computer-executable instructions or data structures received over a network or data link can be buffered in RAM within a network interface card, and then eventually transferred to computer system RAM and/or to less volatile physical storage media at a computer system. Thus, it should be understood that physical storage media can be included in computer system components that also (or even primarily) utilize transmission media.

Computer-executable instructions comprise, for example, instructions and data which cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for testing a system, the apparatus comprising:
a plurality of inputs each adapted to receive a signal from a test point in the system under test;
a switching module including:
a first output selectively coupled to receive and output one or more of the plurality of inputs; and
a set of outputs excluding the first output and corresponding in number to the plurality of inputs, each of the outputs in the set of outputs being selectively coupled to receive and output a corresponding one of the plurality of inputs;
a neural network coupled to the set of outputs of the switching module, the neural network configured to measure electrical characteristics of each of the test points of the system under test at the same time when the set of outputs is selectively coupled to output the plurality of inputs to the neural network; and
a test meter coupled to the first output of the switching module such that the test meter can measure electrical characteristics of the test points when the first output is selectively coupled to output the one or more of the plurality of inputs to the test meter;
wherein when the first output is selectively coupled to output the one or more of the plurality of inputs to the test meter, the switching module is configured to sequentially couple one or more combinations of test points of the system under test to the test meter such that electrical characteristics of a first test point of the combination of test points relative to one or more other test points of the combination of test points is determined.

2. The apparatus of claim 1, further comprising a controller configured to control the selective coupling performed by the switching module.

3. The apparatus of claim 1, wherein the switching module further includes a second output associated with the first output and selectively coupled to receive one or more of the inputs.

4. The apparatus of claim 3, wherein the switching module includes a plurality of multiplexers each coupled to one of the plurality of inputs and each having a first selectable output coupled to the first switching module output via a first bus line and a second selectable output coupled to a second switching module output via a second bus line.

5. The apparatus of claim 3, wherein the first and second outputs are configured to interface with the test meter.

6. The apparatus of claim 1, wherein the switching module includes a plurality of multiplexers each coupled to one of the plurality of inputs and each having a selectable output coupled to the first switching module output via a bus line.

7. The apparatus of claim 1, wherein the test meter is configured to measure a resistance, an impedance, a capacitance, a diode breakdown or conduction, a voltage, or another electrical property.

8. An apparatus for testing a system, the apparatus comprising:
at least one row sense line and at least one column sense line;
an array of nodes each receiving a signal from the system under test, wherein each node is electrically coupled to a specific test pin and a switch specific to the node, the nodal switch being electrically coupled to the specific test pin, each of the nodal switches being configured to selectively couple a signal that is alternative to the system under test signal received at the corresponding node to the at least one row sense line and the at least one column sense line;
a circuit coupled to the at least one row sense line and configured to detect the signal coupled to the row sense line; and
a circuit coupled to the at least one column sense line and configured to detect the signal coupled to the column sense line.

9. The apparatus of claim 8, wherein the alternative signal is ground.

10. The apparatus of claim 8, wherein at least one of the circuit coupled to the at least one row sense line and the circuit coupled to the at least one column sense line includes a latching comparator configured to compare the signal detected by the at least one circuit with a reference threshold and to latch the signal when the signal meets the reference threshold.

11. The apparatus of claim 8, wherein the at least one row sense line comprises a plurality of row sense lines, wherein the circuit coupled to the at least one row sense line further comprises a plurality of latching row comparators each coupled to receive the corresponding signal from an individual row sense line, compare the corresponding signal with a reference voltage, and latch an output when the corresponding signal equals or exceeds the reference voltage, and
wherein the apparatus further comprises a register, wherein the register is loaded upon a latching row comparator detecting the corresponding signal, and wherein the register is loaded with data comprising an identity of the latching row comparator that detected the signal.

12. The apparatus of claim 11, wherein the at least one column sense line comprises a plurality of column sense lines, and wherein the circuit coupled to the at least one column sense line further comprises a plurality of latching column comparators each coupled to receive the corresponding signal from an individual column sense line, compare the corresponding signal with the reference voltage, and latch an asserted output when the corresponding signal equals or exceeds the reference voltage, and
wherein the register is loaded with data further comprising an identity of the latching column comparator that detected the signal.

13. The apparatus of claim 12, wherein the register is loaded upon at least one latching row comparator and at least one latching column comparator simultaneously detecting the signal, the register being loaded with data comprising the identity of the at least one latching row comparator detecting the signal and the identity of the at least one latching column comparator detecting the signal.

14. The apparatus of claim 8, wherein the at least one row sense line comprises a plurality of row sense lines and the at least one column sense line comprises a plurality of column sense lines, and further comprising:
a circuit for coupling a stimulus current to the nodes attached to a given row sense line; and
a circuit for inputting to a processor data from the circuit coupled to the at least one column sense line.

15. The apparatus of claim 14, further comprising a display and a memory containing a database of patterns, wherein the processor is configured to compare a pattern of data from the circuit coupled to the at least one column sense line with patterns in the database and to place on the display information regarding a best match found.

16. An apparatus for testing a system, the apparatus comprising:

a testing module configured to couple to a plurality of test points on the system under test and to carry out test procedures in accordance with a testing mode to generate test results; and a processor communicatively coupled to the testing module and configured to control a testing mode of the testing module and to receive the test results, wherein the processor is further configured to control a display to show a graphical representation of locations of the plurality of test points relative to each other and a graphical representation of the test results overlaid on the graphical representation of test point locations such that a user can visually identify test points associated with the test results, wherein the processor is further configured to display a logarithmically scaled view of test results corresponding to a subset of the test points along a time axis.

17. The apparatus of claim 16, wherein the testing mode is one of a continuity testing mode and a short circuit testing mode.

18. The apparatus of claim 16, wherein the processor is further configured to display a representation of testing progress by color coding test points that have been tested with a first color and color coding test points that have not been tested with a second color.

19. The apparatus of claim 16, wherein the representation of the test results includes a color coding of malfunctioning test points with a first color and a color coding of functioning test points with a second color.

20. The apparatus of claim 16, wherein the testing module includes a switching module therein that selectively couples the test points to a meter, the meter being configured to take resistance measurements and to transmit the measurements as the test results.

21. The apparatus of claim 20, wherein the testing module further includes:

an array of nodes each having circuitry coupled thereto, the nodal circuitry being configured to selectively couple a signal from one of the test points to at least one row sense line and at least one column sense line;

a circuit coupled to the at least one row sense line and configured to detect the signal coupled to the row sense line; and a circuit coupled to the at least one column sense line and configured to detect the signal coupled to the column sense line, wherein the switching module is configured to selectively couple the test points to the array of cells.

22. The apparatus of claim 16, wherein the processor is further configured to display the test results in association with corresponding test points in a tabular format.

23. The apparatus of claim 16, wherein the processor is configured to update the representation of test results on the display in real-time as the test results are received.

24. The apparatus of claim 16, wherein the processor is configured to detect a discrepancy in the test results corresponding to the subset of test points and to automatically display the logarithmically scaled view upon detection of the discrepancy.

* * * * *